(12) United States Patent  
Takagi (10) Patent No.: US 8,278,685 B2  
(45) Date of Patent: Oct. 2, 2012

(54) SEMICONDUCTOR DEVICE USED WITH HIGH FREQUENCY BAND

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 12/514,933

(22) PCT Filed: Dec. 3, 2007

(86) PCT No.: PCT/JP2007/073308  
§ 371 (c)(1),  
(2), (4) Date: Jun. 10, 2009

(87) PCT Pub. No.: WO2008/120418  
PCT Pub. Date: Oct. 9, 2008

(65) Prior Publication Data  
US 2010/0059791 A1    Mar. 11, 2010

(30) Foreign Application Priority Data

Apr. 2, 2007    (JP) .................................. 2007-096851

(51) Int. Cl.  
*H01L 29/66* (2006.01)
(52) U.S. Cl. ........ 257/192; 257/622; 257/774; 257/401; 438/638; 438/639; 438/640; 438/135; 438/197
(58) Field of Classification Search .................. 257/774, 257/775, 758, E51.005, E21.578, E21.577, 257/205, 206, 288, 341, 350, 401, 192, 213, 257/397, 396, 513, 559, 571, 586, 599, 618, 257/622, 287, 275, 276, 277; 438/637, 638, 438/639, 640, 668, 135, 142, 154, 151, 155, 438/197, 199, 275, 279, 454, 675  
See application file for complete search history.

(56) References Cited

U.S. PATENT DOCUMENTS 5,343,071 A     8/1994   Kazior et al.  
(Continued)

FOREIGN PATENT DOCUMENTS

EP      1 693 891 A2    8/2006  
(Continued)

OTHER PUBLICATIONS

Extended European Search Report issued Feb. 15, 2011, in Patent Application No. 07832928.1.

(Continued)

*Primary Examiner* — Ha Tran T Nguyen  
*Assistant Examiner* — Thanh Y Tran  
(74) *Attorney, Agent, or Firm* — Oblon, Spivak, McClelland, Maier & Neustadt, L.L.P.

(57) ABSTRACT

A semiconductor device, which reduces the earth inductance, and a fabrication method for the same is provided.

The semiconductor device and the fabrication method for the same including: a gate electrode, a source electrode, and a drain electrode which are placed on a first surface of a semi-insulating substrate 11, and have a plurality of fingers; an earth conductor 26 placed on a second surface of an opposite side with the first surface; a gate terminal electrode 14, a source terminal electrode 18, and a drain terminal electrode 12 which are connecting a plurality of fingers, respectively, and formed for every the gate electrode, the source electrode, and the drain electrode; an active layer formed on the semi-insulating substrate 11 under the gate electrode, the source electrode, and the drain electrode; a multi stage VIA hole composed of a small caliber VIA hole 30 near the first surface and a large caliber VIA hole 20 near the second surface; and an earth electrode 23 which is formed in an internal wall surface of the multi stage VIA hole and the second surface, and is connected from an earth conductor placed at the second surface side for the source terminal electrode 18.

4 Claims, 7 Drawing Sheets

U.S. PATENT DOCUMENTS

| | | |
|---|---|---|
| 5,770,513 A | 6/1998 | Okaniwa |
| 2002/0048889 A1* | 4/2002 | Hayama et al. ............... 438/304 |
| 2006/0046471 A1 | 3/2006 | Kirby et al. |
| 2007/0001168 A1 | 1/2007 | Kirby et al. |
| 2007/0046379 A1* | 3/2007 | Tanahashi et al. ............ 330/311 |

FOREIGN PATENT DOCUMENTS

| | | |
|---|---|---|
| EP | 1 693 891 A3 | 8/2006 |
| JP | 62 211962 | 9/1987 |
| JP | 63 278368 | 11/1988 |
| JP | 2 288409 | 11/1990 |
| JP | 2 307219 | 12/1990 |
| JP | 6 326064 | 11/1994 |
| JP | 2001 28425 | 1/2001 |
| JP | 2002-217194 | 8/2002 |
| JP | 2003-078127 | 3/2003 |

OTHER PUBLICATIONS

Kiat T. Ng, et al. "A Sub-Surface Metallization Post-Process IC Module for RF Technology", Proceedings of the 2000 Bipolar/Bicmos Circuits and Technology Meeting, BCTM, Sep. 24, 2000, pp. 195-198.

Office Action issued Jun. 26, 2012 in Japanese Patent Application No. 2007-096851, filed Apr. 2, 2007 (with English-language Translation), 4 pages.

* cited by examiner

SEMICONDUCTOR DEVICE USED WITH HIGH FREQUENCY BAND

TECHNICAL FIELD

The present invention relates to a semiconductor device used with a high frequency band, and a fabrication method for the same. In particular, the present invention relates to a semiconductor device having the characteristic in the VIA shape of a semiconductor chip in the forming earth electrode of element in which it is difficult to apply thin layers, such as GaN/SiC, and a fabrication method for the same.

BACKGROUND ART

A semiconductor device used with a high frequency band, for example, a microwave power amplifier, is composed of active elements, such as a field effect transistor, and passive elements, such as resistance and a capacitor, and circuit elements, such as a microstrip line for transmitting a high frequency signal.

These circuit elements are formed, for example on the semi-insulating substrate. An earth electrode is formed on the backside of the semi-insulating substrate. And when earthing the circuit element, the circuit element provided on the semi-insulating substrate and the earth electrode formed on the back side of the semi-insulating substrate are electrically connected through the VIA hole which passes through the semi-insulating substrate, for example.

A VIA hole has a structure which provides a hole passed through from one surface of the semi-insulating substrate to the surface of another side, and forms the earth electrode in the internal wall surface of the VIA hole. The VIA hole is formed, for example by etching, and the earth electrode is formed by plating, vacuum evaporation, etc. The VIA hole of the configuration described above has some which are described in Patent Literature 1, Patent Literature 2, etc.

Patent Literature 1: Japanese Patent Application Laying-Open Publication No. H02-288409.

Patent Literature 2: Japanese Patent Application Laying-Open Publication No. 2001-28425.

Figure 7:
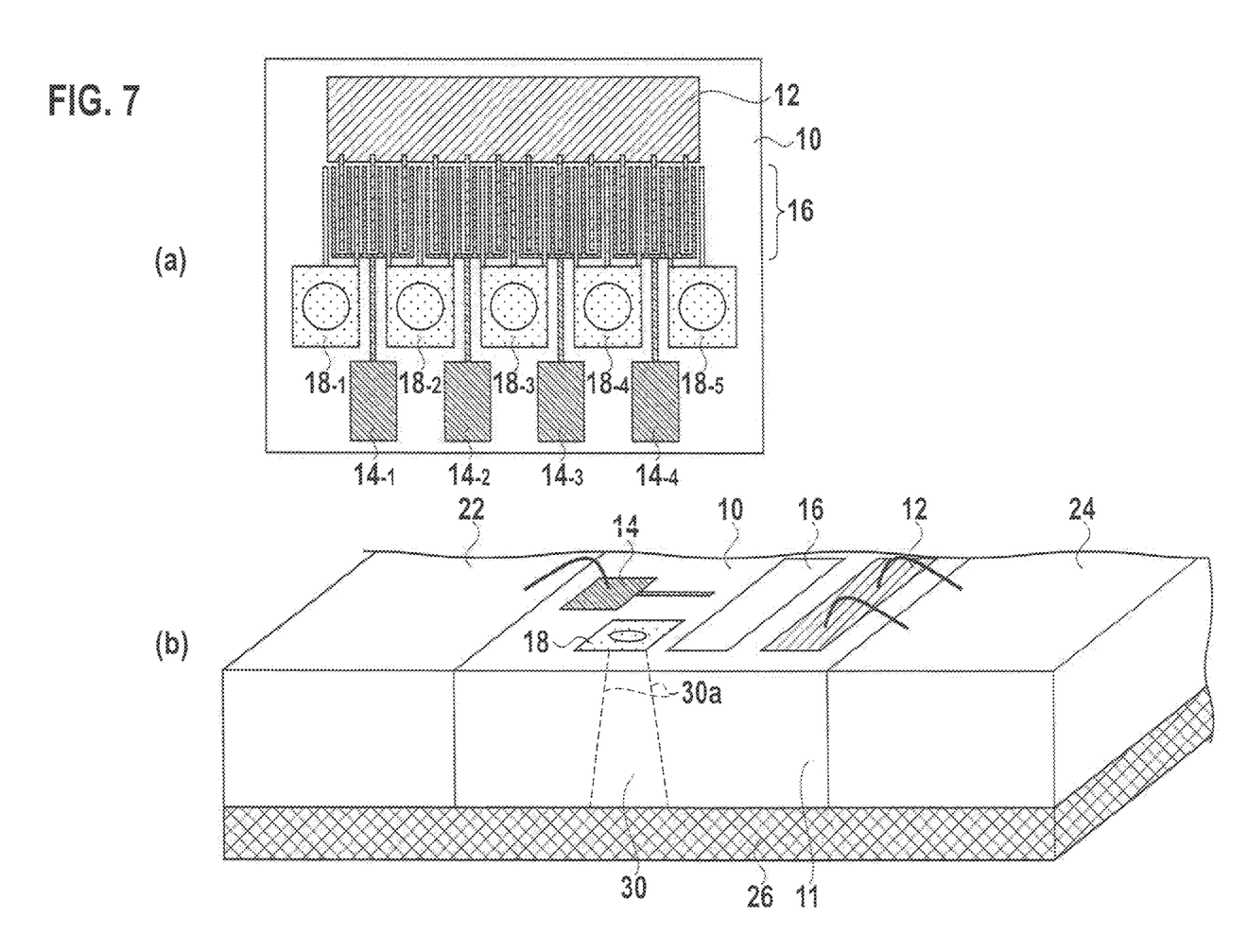
FIG. 7 It is a schematic configuration of a semiconductor device according to a conventional example, (a) is a plane pattern configuration diagram, and (b) is a schematic perspective diagram near a small caliber VIA hole 30 formed for a source terminal electrode 18.

FIG. 7 shows a schematic configuration of the semiconductor device according to a conventional example, FIG. 7(a) shows a plane pattern configuration diagram, and FIG. 7(b) shows a schematic perspective diagram near a small caliber VIA hole 30 formed for the source terminal electrode 18.

As shown in FIGS. 7(a) and (b), as for the semiconductor device according to the conventional example, on a semiconductor chip 10, a gate electrode, a source electrode, and a drain electrode have a plurality of fingers, the plurality of fingers are connected for every gate electrode, source electrode, and drain electrode, and the electrode for terminals is formed. The part into which the gate electrode, the source electrode, and the drain electrode have the plurality of finger shape forms an exothermic unit 16, as shown in FIG. 7(a). In the example of FIG. 7(a), gate terminal electrodes 14, 14-1, 14-2, 14-3, and 14-4 and source terminal electrodes 18, 18-1, 18-2, 18-3, 18-4, and 18-5 are placed on a terminal of one side, and a drain terminal electrode 12 is placed on a terminal of another side.

Near the surface of a semi-insulating substrate 11, an active layer is formed on the semi-insulating substrate 11 under the gate electrode, the source electrode, and the drain electrode. The active layer forms the exothermic unit 16.

The semiconductor device according to the conventional example forms the small caliber VIA hole 30 for the source terminal electrodes 18, 18-1, 18-2, 18-3, 18-4, and 18-5 near the active layer.

In addition, the gate terminal electrodes 14, 14-1, 14-2, 14-3, and 14-4 are connected to a surrounding semiconductor chip 22 via a bonding wire etc., and the drain terminal electrode 12 is also connected to a surrounding semiconductor chip 24 via a bonding wire etc. Moreover, for the source terminal electrodes 18, 18-1, 18-2, 18-3, 18-4, and 18-5, as shown in FIG. 7(b), the small caliber VIA hole 30 is formed from the back side of the semi-insulating substrate 11, and an earth conductor 26 is formed on the back side of the semi-insulating substrate 11. And when earthing the circuit element, the circuit element provided on the semi-insulating substrate 11 and the earth conductor 26 formed on the back side of the semi-insulating substrate 11 are electrically connected through the small caliber VIA hole 30 which passes through the semi-insulating substrate 11.

The earth conductor 26 via the small caliber VIA hole 30 according to conventional technology is connected to the source terminal electrode 18 through the conductive layer (not shown) formed in an internal wall surface 30a of one step of small caliber VIA hole 30 of conical shape, as shown in FIG. 7(b).

Furthermore, the miniaturization of the small caliber VIA hole 30 is further performed with the miniaturization of the source terminal electrodes 18, 18-1, 18-2, 18-3, 18-4, and 18-5. Although it did not become a problem in the semiconductor chip with thin thickness of the semi-insulating substrate 11, since the length of the small caliber VIA hole 30 amounts also to 100 micrometers, it is impossible to ignore the inductance in GaN HEMT which applies as the substrate SiC in which it is difficult to apply a thin layer.

Moreover, if the small caliber VIA hole 30 is applied into a major diameter to directly under the exothermic unit 16 region, it becomes a cause which obstructs diffusion of heat by the cavity area.

Furthermore, in the conventional semiconductor device, the small caliber VIA hole 30 is formed, for example by etching, and the conductive layer formed in the internal wall surface of the small caliber VIA hole 30 is formed by methods, such as plating and vacuum evaporation. However, when forming the conductive layer in the internal wall surface of the small caliber VIA hole 30, the so-called disconnection caused by step by which the metal which performs plating and vacuum evaporation is not fully formed, and the conductive layer is not formed in a part of internal wall surface of the small caliber VIA hole 30 may occur. As a result, earthing of the circuit element becomes insufficient and it becomes a cause by which the electrical characteristics of the semiconductor device for microwave power amplification, etc. deteriorated.

The object of the present invention is to provide a semiconductor device which suppresses the inductance of the source terminal electrode connected to the earth electrode by using a small caliber VIA hole near the active layer, connecting with a surface electrode in minute size, and extending a caliber near the earth conductor, and a fabrication method for the same.

Furthermore, the object of the present invention is to provide a semiconductor device which improves the efficiency of heat dissipation without extending the cavity area by the VIA hole directly under the heating region by performing eccentricity of the large caliber VIA hole to the outside of the semiconductor chip, and a fabrication method for the same.

Furthermore, the object of the present invention is to provide a semiconductor device which solves the above-mentioned fault and prevents the disconnection caused by step of the VIA hole, etc., and a fabrication method for the same.

DISCLOSURE OF INVENTION

According to one aspect of the present invention for achieving the above-mentioned object, a semiconductor device comprising: a semi-insulating substrate; a gate electrode, a source electrode, and a drain electrode which are placed on a first surface of the semi-insulating substrate, and have a plurality of fingers, respectively; a ground conductor placed on a second surface of an opposite side with the first surface of the semi-insulating substrate; a gate terminal electrode, a source terminal electrode, and a drain terminal electrode which are placed on the first surface of the semi-insulating substrate, connecting a plurality of fingers, respectively, and formed for every the gate electrode, the source electrode, and the drain electrode; an active layer formed on the semi-insulating substrate under the gate electrode, the source electrode, and the drain electrode; a multi stage VIA hole composed of a small caliber VIA hole near the first surface, and a large caliber VIA hole near the second surface; and a ground electrode which is formed in an internal wall surface of the multi stage VIA hole and the second surface of the semi-insulating substrate, and is connected from a ground conductor placed at the second surface side of the semi-insulating substrate for the source terminal electrode near the first surface, is provided.

According to another aspect of the present invention, a semiconductor device comprising: a semi-insulating substrate in which an electrode is formed on a first surface and a multi stage VIA hole composed of a small caliber VIA hole and a large caliber VIA hole passed through on a second surface of the opposite side with the first surface is formed; and an earth electrode which is formed in an internal wall surface of the multi stage VIA hole composed of the small caliber VIA hole and the large caliber VIA hole, and is electrically connected with the electrode, wherein the small caliber VIA hole includes a tapered region where the width of the inside diameter of a part located in the second surface side is larger than the width of the inside diameter of a part located in the first surface side, and the large caliber VIA hole includes a tapered region where the width of the inside diameter of a part located in the second surface side is larger than the width of the inside diameter of a part located in the first surface side, is provided.

According to another aspect of the present invention, a fabrication method of a semiconductor device characterized by comprising: forming a small caliber VIA hole for a semi-insulating substrate by applying as a mask to a mask layer which does not have a taper beforehand; and forming a large caliber VIA hole which has an inclination rather than the small caliber VIA hole for the semi-insulating substrate by applying as a mask to a mask layer which has the taper, is provided.

According to another aspect of the present invention, a fabrication method of a semiconductor device comprising: a first step of forming a mask layer composed of material whose etching rate is smaller than a semi-insulating substrate on a second surface of the semi-insulating substrate on which an electrode is formed on a first surface; a second step of forming a resist layer on the mask layer; a third step of illuminating the resist layer through a first mask pattern which provides a region along which light passes, and forming a first aperture in the resist layer; a fourth step of heating the resist layer in which the first aperture is formed, and forming a first tapered region where a thickness becomes thin toward the first aperture side around the first aperture of the resist layer; a fifth step of forming a second aperture that a part of the second surface of the semi-insulating substrate exposes by etching the mask layer using the first aperture of the resist layer, and forming a second tapered region where a thickness becomes thin toward the second aperture side around the second aperture; a sixth step of removing the resist layer remained on the mask layer; a seventh step of forming a small caliber VIA hole which has a third tapered region where the width of the inside diameter of a part located in the second surface side of the semi-insulating substrate is larger than the width of the inside diameter of a part located in the first surface side rather than this, by etching the semi-insulating substrate using the second aperture; a eighth step of forming a large caliber VIA hole by the same steps of the first to seventh steps, and using a second mask pattern wider than the first mask pattern; and a ninth step of forming an earth electrode in the internal wall surface of the multi stage VIA hole composed of the small caliber VIA hole and the large caliber VIA hole, is provided.

BEST MODE FOR CARRYING OUT THE INVENTION

Next, an embodiment of the invention is described with reference to drawings. In the description of the following drawings, the identical or similar reference numeral is attached to the identical or similar part. However, a drawing is schematic and it should care about differing from an actual thing. Of course, the part from which the relation and ratio of a mutual size differ also in mutually drawings is included.

The embodiment shown in the following exemplifies the device and method for materializing the technical idea of this invention, and the technical idea of this invention does not specify placement of each component parts, etc. as the following. The technical idea of this invention can add various change in scope of claims.

First Embodiment

FIG. 1(a) shows a schematic plane pattern configuration of a semiconductor device according to a first embodiment of the present invention, and FIG. 1(b) shows a schematic perspective diagram near a VIA hole of a large caliber. Moreover, FIG. 2 shows a three-dimensional schematic configuration of a multi stage VIA hole by a VIA hole 20 of a large caliber and a VIA hole 30 of a small caliber which are formed in the semiconductor device according to the first embodiment of the present invention.

As shown in FIGS. 1(a) and (b), a configuration of the semiconductor device according to the first embodiment of the present invention is characterized by including a semi-insulating substrate 11 on a semiconductor chip 10; a gate electrode $2_1, 2_2, 2_3, 2_4, 2_5$ and $2_6$, a source electrode $3_1, 3_2$ and $3_3$, and a drain electrode $4_1, 4_2, 4_3, \ldots 4_{12}$ which are placed on a first surface of the semi-insulating substrate 11, and have a plurality of fingers, respectively; a ground conductor 26 placed on a second surface of the opposite side on the first surface of the semi-insulating substrate 11; gate terminal electrodes 14-1, 14-2, 14-3, and 14-4, source terminal electrodes 18, 18-1, 18-2, 18-3, 18-4, and 18-5, and a drain terminal electrode 12 which are placed on the first surface of the semi-insulating substrate 11, governed a plurality of fingers, respectively and are formed for every gate electrode $2_1, 2_2, 2_3, 2_4, 2_5$ and $2_6$, source electrode $3_1, 3_2$ and $3_3$, and drain electrode $4_1, 4_2, 4_3, \ldots 4_{12}$; an operation layer (active layer (AA)) formed on the semi-insulating substrate 11 of the lower part of the gate electrode $2_1, 2_2, 2_3, 2_4, 2_5$ and $2_6$, the source electrode $3_1, 3_2$ and $3_3$, and the drain electrode $4_1, 4_2, 4_3, \ldots 4_{12}$; a multi stage VIA hole which is composed of a small caliber VIA hole near the operation layer and a large caliber VIA hole near the ground conductor 26; and a ground electrode 23 which is formed in an internal wall surface of the multi stage VIA hole and the second surface of the semi-insulating substrate 11, and is connected from the second surface side of the semi-insulating substrate 11 for the source terminal electrodes 18, 18-1, 18-2, 18-3, 18-4, and 18-5 near the operation layer.

Figure 1:
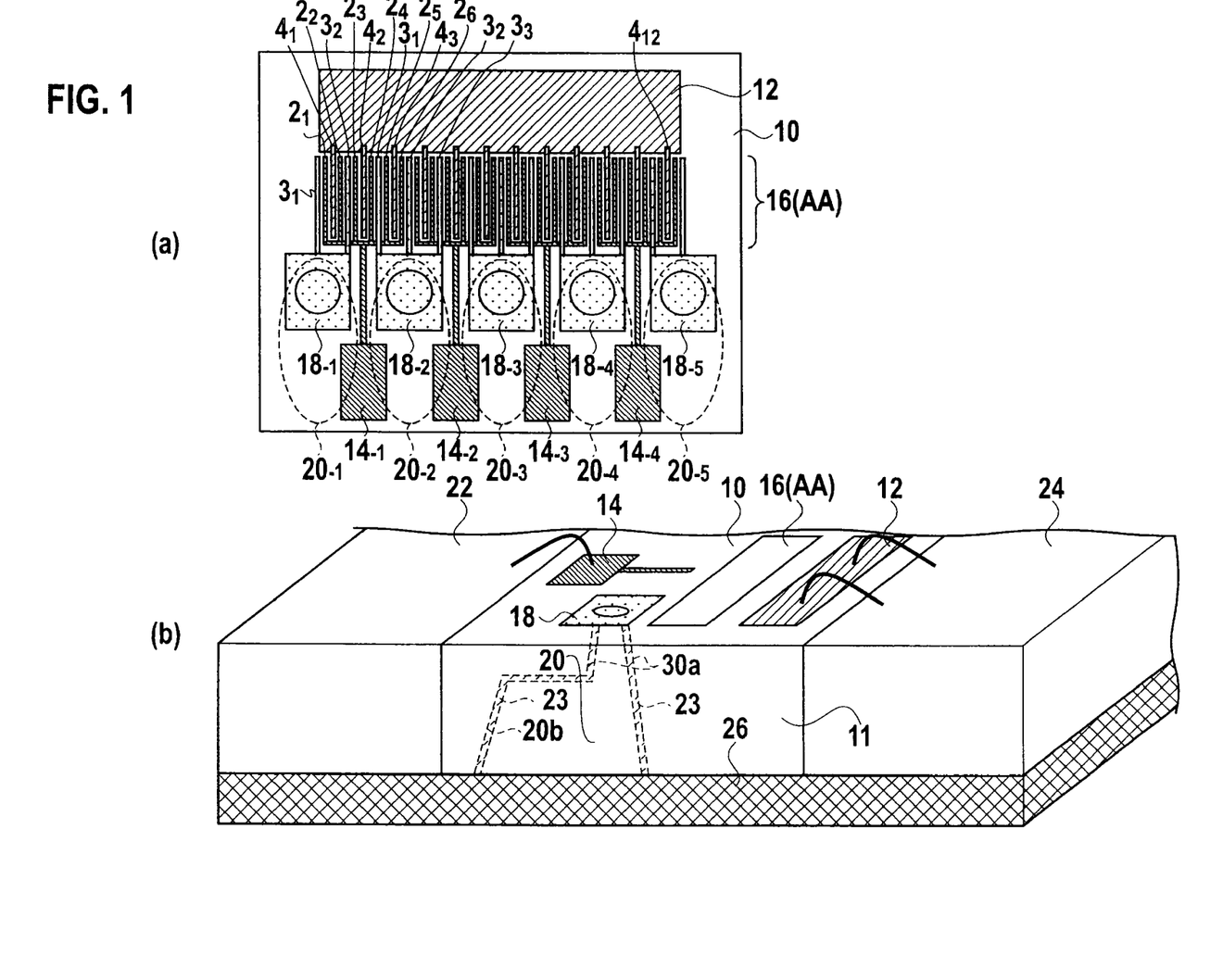
FIG. 1 It is a schematic configuration of a semiconductor device according to a first embodiment of the present invention, (a) is a schematic plane pattern configuration diagram, and (b) is a schematic perspective diagram near a VIA hole of a large caliber.
Figure 2:
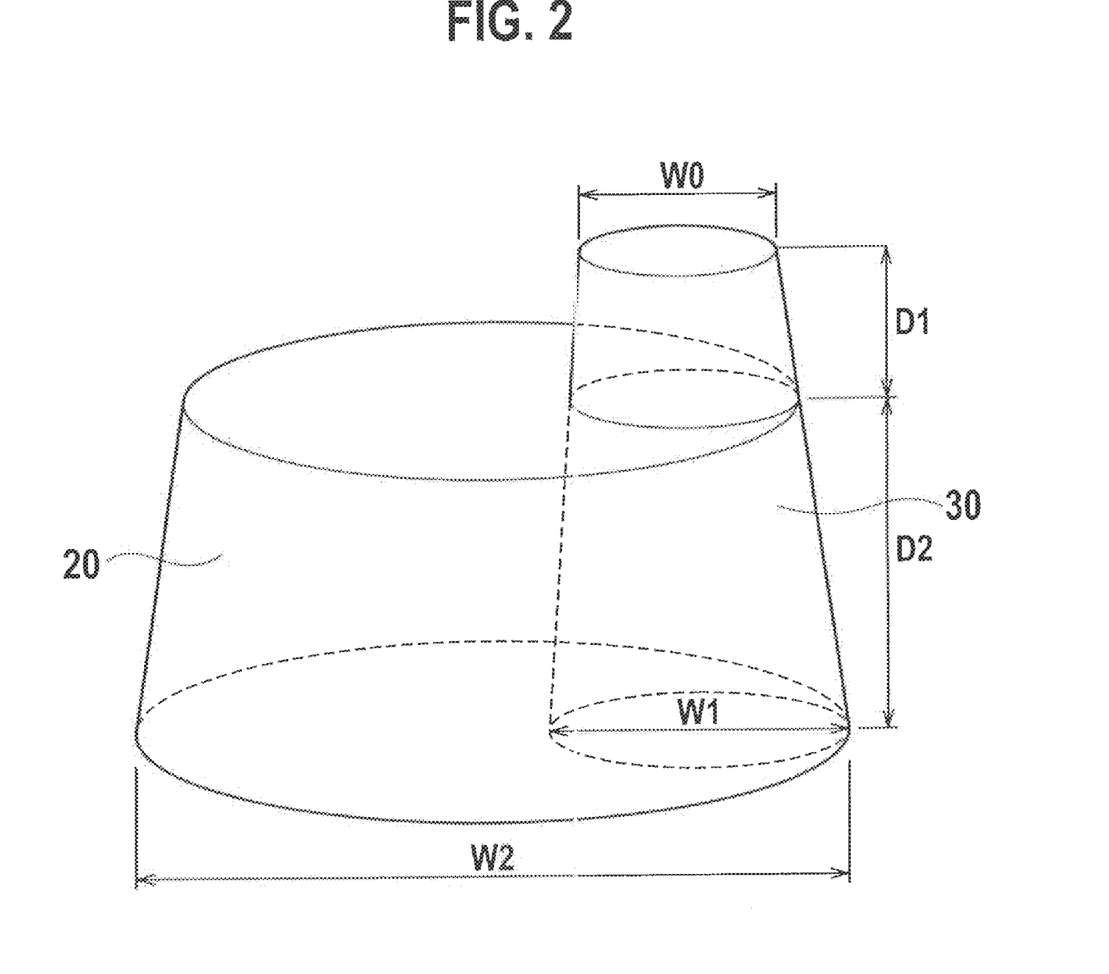
FIG. 2 It is a three-dimensional schematic configuration diagram of a multi stage VIA hole by a VIA hole 20 of a large caliber and a VIA hole 30 of a small caliber which are formed in the semiconductor device according to the first embodiment of the present invention.

Moreover, in the semiconductor device according to the first embodiment of the present invention, as shown in FIG. 1 to FIG. 2, it is characterized by the center of the large caliber VIA hole performing eccentricity in the direction of the circumference of the semiconductor chip 10 rather than the center of the small caliber VIA hole.

Figure 5:
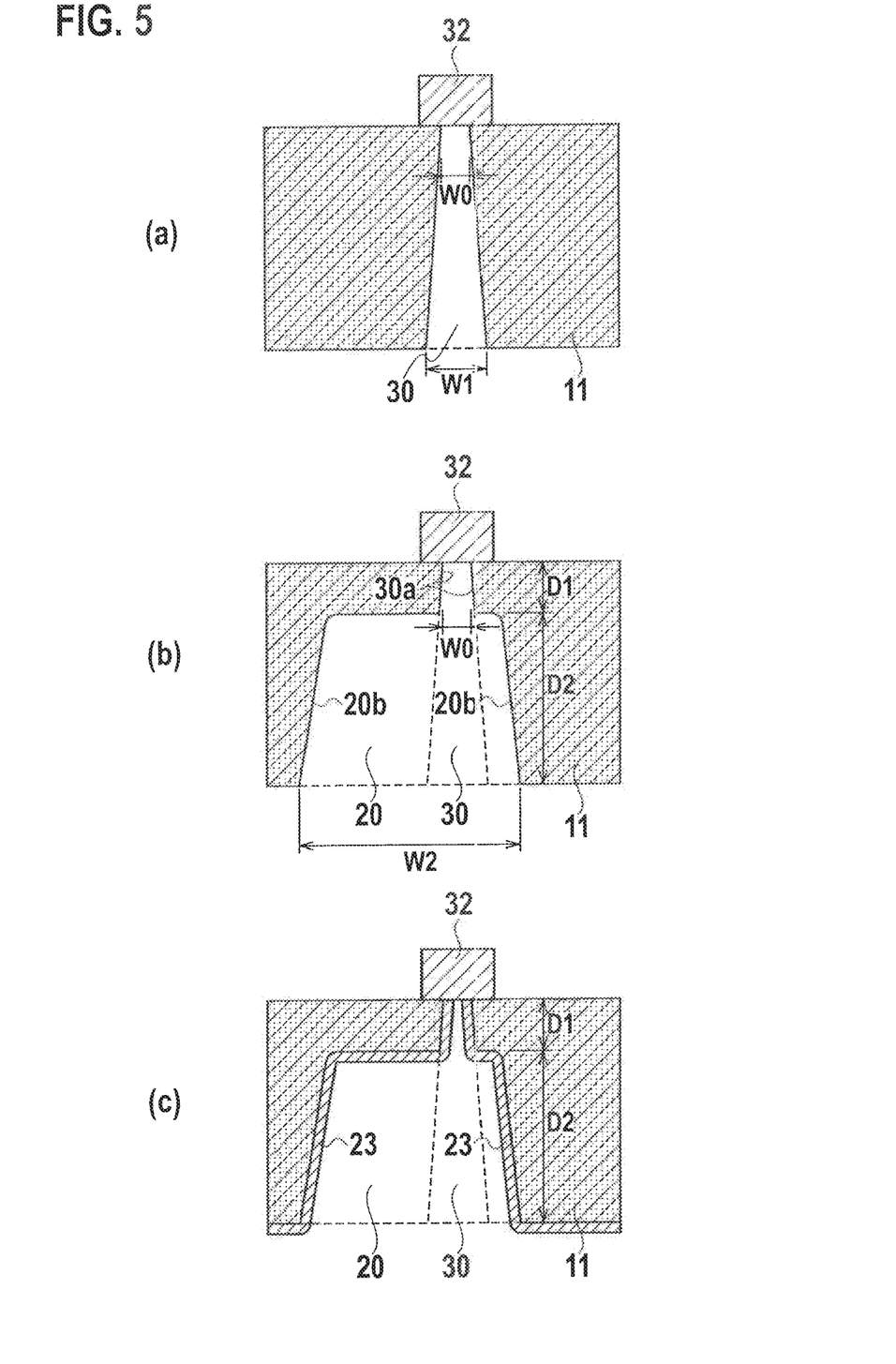
FIG. 5 It is an explanatory diagram of the multi stage VIA hole formation process applied to the fabrication method of the semiconductor device according to the first embodiment of the present invention, (a) is a formation process chart of the VIA hole 30 of a small caliber, (b) is a formation process chart of the VIA hole 20 of a large caliber, and (c) is a formation process chart of the earth electrode 23.
Figure 6:
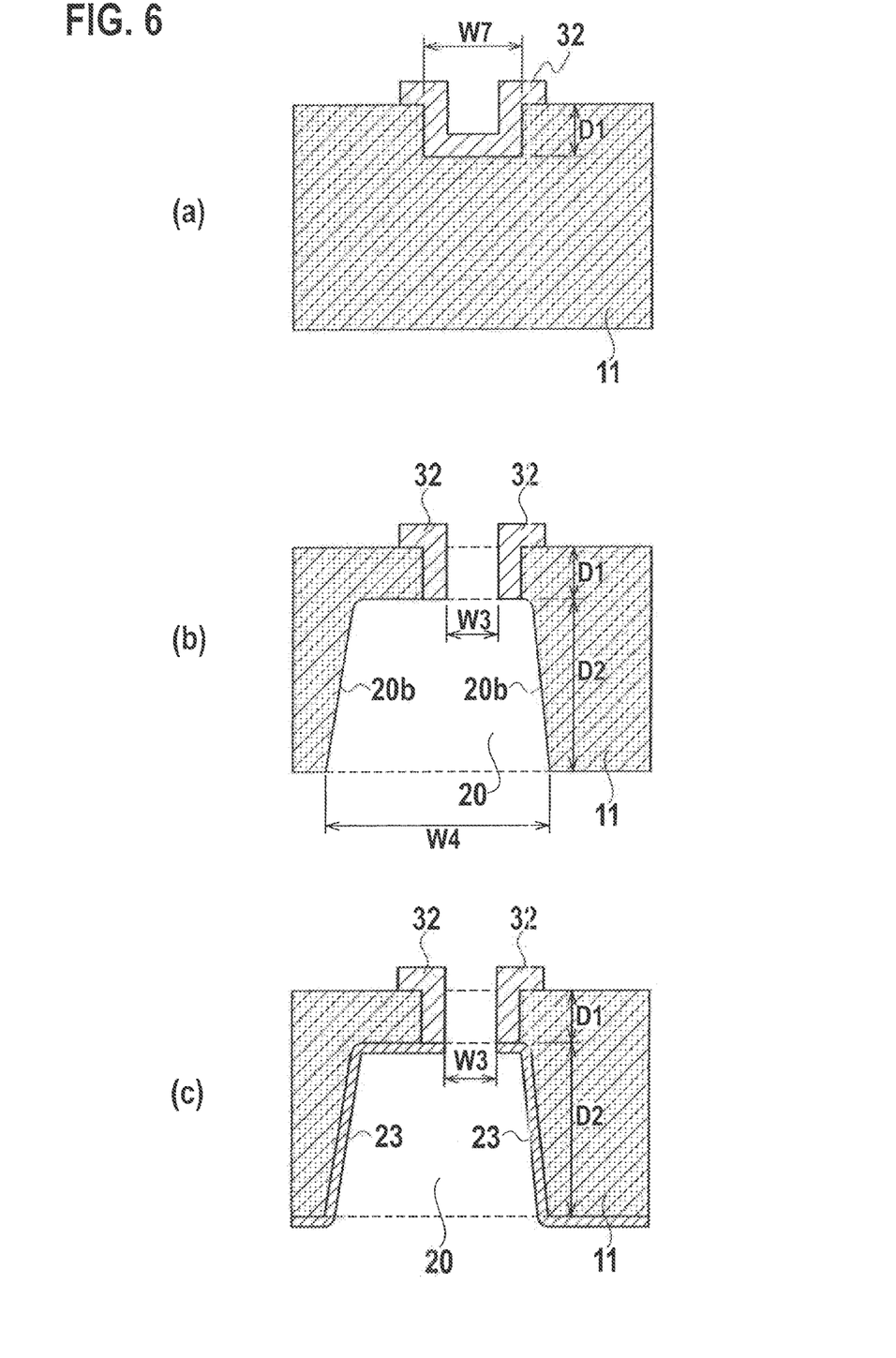
FIG. 6 It is an explanatory diagram of another process step of the multi stage VIA hole formation process applied to the fabrication method of the semiconductor device according to the first embodiment of the present invention, (a) is a formation process chart of the trench of the depth D1 acting as the VIA hole 30 of the small caliber, (b) is a formation process chart of the VIA hole 20 of the large caliber, and (c) is a formation process chart of the earth electrode 23.

Although FIG. 5 to FIG. 6 are explanatory diagrams of the multi stage VIA hole formation process applied to a fabrication method described later of the semiconductor device according to the first embodiment of the present invention, it shows the shape of the multi stage VIA hole simultaneously.

In the semiconductor device according to the first embodiment of the present invention, as shown in FIG. 5 to FIG. 6, it is characterized by including: the semi-insulating substrate 11 in which an electrode 32 is formed in the first surface and a multi-stage VIA hole composed of the small caliber VIA hole 30 and the large caliber VIA hole 20 passed through on the second surface of the opposite side for the first surface is formed; the earth electrode 23 which is formed in internal wall surfaces 30a and 20b of the multi stage VIA hole composed of the small caliber VIA hole 30 and the large caliber VIA hole 20, and is electrically connected with the electrode 32; and a tapered region where the width W1 of the inside diameter of a part located in the second surface side in the small caliber VIA hole 30 is larger than the width W0 of the inside diameter of a part located in the first surface side, and the width W2 of the inside diameter of a part located in the second surface side in the large caliber VIA hole 20 is larger than the width of the inside diameter of a part located in the first surface side.

Moreover, in the semiconductor device according to the first embodiment of the present invention, the semi-insulating substrate 11 is characterized by being an SiC substrate, a GaN substrate, a substrate in which a GaN epitaxial layer is formed on the SiC substrate, a substrate in which a heterojunction epitaxial layer composed of GaN/AlGaN is formed on the SiC substrate, a sapphire substrate, or a diamond substrate.

As shown in FIGS. 1(a) and (b), the gate terminal electrodes 14, 14-1, 14-2, 14-3, and 14-4 are connected to a surrounding semiconductor chip 22 via a bonding wire etc., and the drain terminal electrode 12 is also connected to a surrounding semiconductor chip 24 via a bonding wire etc. Moreover, for the source terminal electrodes 18, 18-1, 18-2, 18-3, 18-4, and 18-5, as shown in FIGS. 1(a) and (b), the small caliber VIA hole 30 is formed and the earth conductor 26 is formed on the back side of the semi-insulating substrate 11. And when earthing the circuit element, the circuit element provided on the semi-insulating substrate 11 and the earth conductor 26 formed on the back side of the semi-insulating substrate 11 are electrically connected via the multi stage VIA hole (refer to FIG. 2) composed of the small caliber VIA hole 30 which passes through the semi-insulating substrate 11 and the large caliber VIA hole 20 formed to the halfway of the semi-insulating substrate 11.

As shown in FIGS. 1(a) and (b), in a configuration of the multi stage VIA hole in the semiconductor device according to the first embodiment of present invention, the earth conductor 26 via the multi stage VIA hole further forms the large caliber VIA hole 20 for one step of the small caliber VIA hole 30 of conical shape, and is earthed through the earth electrode (23) formed in the internal wall surface 20b of the large caliber VIA hole 20 and the internal wall surface 30a of the small caliber VIA hole 30.

Although the miniaturization of the small caliber VIA hole is further performed by such the structure with the miniaturization of the source terminal electrodes 18, 18-1, 18-2, 18-3, 18-4, and 18-5, the earth electrode which suppressed occurring of parasitic inductances also in the semiconductor chip of the thick semi-insulating substrate 11 can be formed by combining the small caliber VIA hole 30 and the large caliber VIA hole 20 with the multistage constitution.

In GaN HEMT which applies as the substrate SiC in which it is difficult to apply a thin layer, although the length of the VIA hole 30 amounts also to 100 micrometers, the earth electrode which suppressed occurring of parasitic inductances can be formed by applying the configuration of the multi stage VIA hole in the semiconductor device according to the first embodiment of the present invention.

In the configuration of the multi stage VIA hole in the semiconductor device according to the first embodiment of the present invention, as shown in FIGS. 1(a) and (b), the center of the large caliber VIA holes 20, 20-1, 20-2, 20-3, 20-4, and 20-5 is performing eccentricity in the direction of surrounding of the semiconductor chip 10 rather than the center of the small caliber VIA hole 30, in the multi stage VIA hole composed of the small caliber VIA hole 30 near the active layer and the large caliber VIA holes 20, 20-1, 20-2, 20-3, 20-4, and 20-5 near the earth conductor 26.

In contrast to becoming a cause which obstructs the diffusion of heat by the cavity area, if extending to directly under the exothermic unit 16 region and forming the large caliber VIA holes 20, 20-1, 20-2, 20-3, 20-4, and 20-5, the thermal conductivity of the semiconductor device according to the first embodiment of the present invention can be secured without obstructing the thermal diffusion directly under the exothermic unit 16 by such the configuration.

(Small Caliber Via Hole Formation Process)

Figure 3:
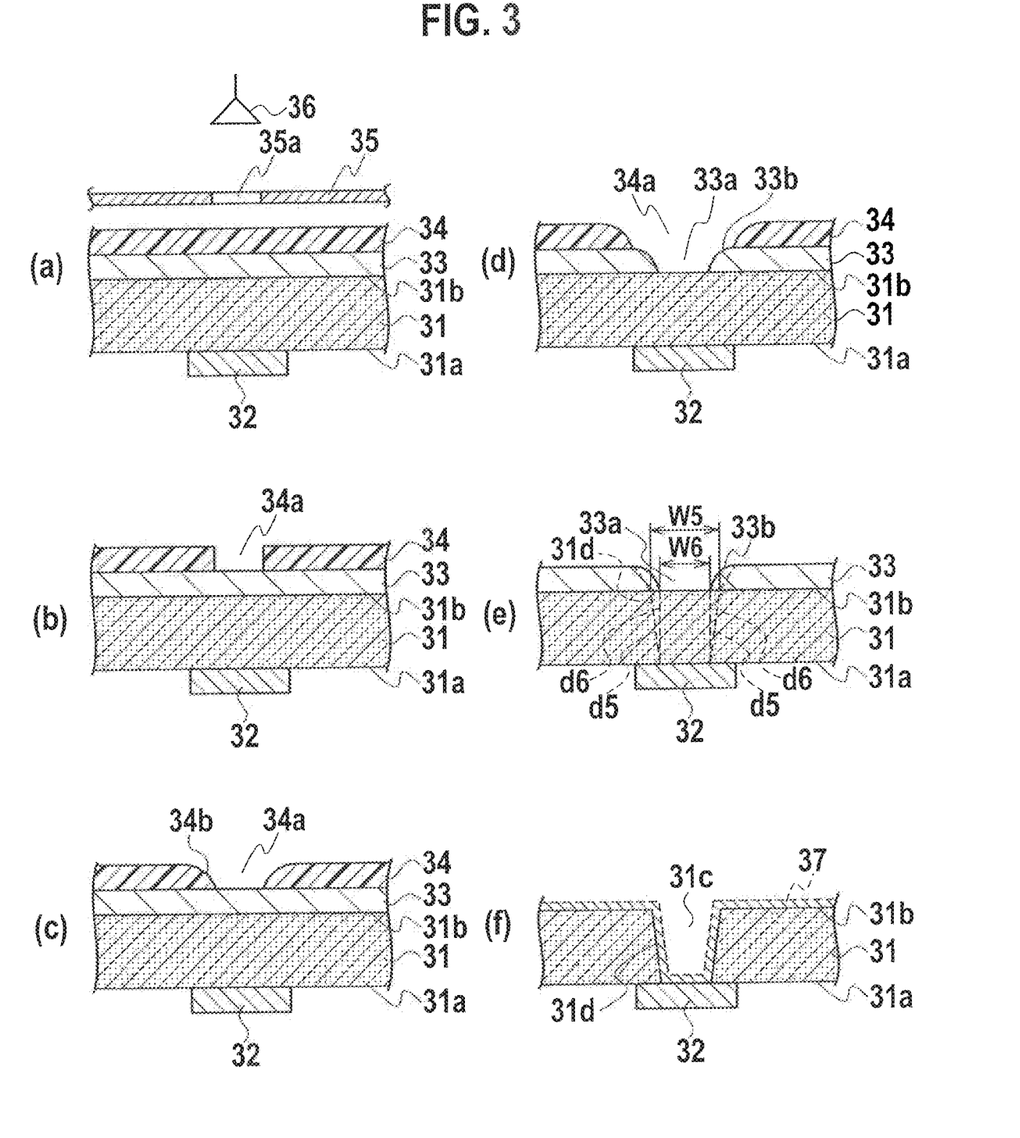
FIG. 3 It is a schematic cross-sectional configuration chart which explains in detail the formation process of the small caliber VIA hole applied at a part of fabrication method of the semiconductor device according to the first embodiment of the present invention, (a) is a photo lithography process chart, (b) is a formation process chart of a first aperture 34a, (c) is a formation process chart of a first tapered region 34b, (d) is an etching process chart of a mask layer 33, (e) is a process chart which forms a third aperture 31c by etching of the semi-insulating substrate 31 using the mask layer 33, and (f) is a process chart which forms an earth electrode 37 and forms a small caliber VIA hole.

FIG. 3 shows a schematic section structure for explaining in detail the formation process of the small caliber VIA hole applied at a part of a fabrication method of the semiconductor device according to the first embodiment of the present invention. FIG. 3(a) shows a photo lithography process chart, FIG. 3(b) shows a formation process chart of the first aperture 34a, FIG. 3(c) shows a formation process chart of the first tapered region 34b, FIG. 3(d) shows an etching process chart of the mask layer 33, FIG. 3(e) shows a process chart which forms the third aperture 31c by etching of the semi-insulating substrate 31 using the mask layer 33, and FIG. 3(f) shows a process chart which forms the earth electrode 37 and forms the small caliber VIA hole.

A small caliber VIA hole formation process applied to a part of the fabrication method of the semiconductor device according to the first embodiment of the present invention will be explained with reference to the process chart of FIG. 3.

(a) First of all, as shown in FIG. 3 (a), an electrode 32 having a certain size is formed on a first surface 31a of the semi-insulating substrate 31, for example on the surface. A semi-insulating substrate 31 is composed of compound semiconductors, such as GaN or SiC, for example. The electrode 32 is formed with Ni etc. The source terminal electrode etc. of the circuit element (not shown) formed on the semi-insulating substrate 31, for example on the first surface 31a of the semi-insulating substrate 31, are connected to the electrode 32.

A mask layer 33 composed of metal, such as Al, is formed on a second surface 31b of the semi-insulating substrate 31, for example on the backside. One of characteristics that an etching rate by etching gas used when performing dry etching of the semi-insulating substrate 31 is smaller than the semi-insulating substrate 31 is used for the metal which forms the mask layer 33, so as to mention later. Moreover, a resist layer 34 is formed on the mask layer 33.

A mask pattern 35 is placed on the upper part of the semi-insulating substrate 31 in which the mask layer 33 and the resist layer 34 are formed. In the mask pattern 35, a transmission hole 35a which lets light pass to a part of that is formed.

The mask pattern 35 is placed so as to become the positioning relationship, which faces the transmission hole 35a and the electrode 32 opposed each other. A luminous source 36 is placed on the opposite side of the semi-insulating substrate 31 on the illustration upper part of the mask pattern 35, for example, on the basis of the mask pattern 35.

(b) Next, as shown in FIG. 3(b), illuminating the resist layer 34 through the mask pattern 35 from the light source 36, performing a development processing afterward, and forming a first aperture 34a in the position which opposes the part with which light is illuminated, for example, the electrode 32. At this time, the mask layer 33 is exposed to a bottom of the first aperture 34a. In addition, the size of the first aperture 34a is smaller than the size of the electrode. Moreover, at this point, the case of a positive resist is explained. However, a negative resist can also be used.

(c) Next, as shown in FIG. 3(c), heating the resist layer 34. By this heating process, the height of marginal upper limit surrounding the first aperture 34a languishes, and a first tapered region 34b where thickness becomes thin toward the first aperture 34a side is formed around the first aperture 34a circularly, for example.

(d) Next, as shown in FIG. 3(d), etching the mask layer 33 using the first aperture 34a of the resist layer 34. The etching is performed by the dry etching process, which used Ar gas or halogen gas, such as F and Cl, for example. By this etching, a second aperture 33a is formed in the mask layer 33, and the second surface (back side) 31b of the semi-insulating substrate 31 is exposed to the bottom of the second aperture 33a.

When etching the mask layer 33, as for the resist layer 34 which functions as a mask, the circumference of the first aperture 34a is the first tapered region 34b (refer to FIG. 1(c)). Therefore, when etching the mask layer 33, also about the first tapered region 34b, etching progresses to outside in order with the passage of time from an inner side where thickness near the first aperture 34a is thin, and the diameter of the first aperture 34a also enlarges gradually.

Therefore, as for the etching of the mask layer 33, first of all, a part exposed to a bottom of the first aperture 34a is etched. Then, with the expansion of the diameter of the first aperture 34a of the resist layer 34, etching progresses to outside gradually from an inner side about the mask layer 33, and a diameter of the second aperture 33a also expands gradually. At this time, the etching of the inner side of the mask layer 33 progresses rather than the outside. Therefore, a second tapered region 33b where the thickness becomes thin gradually, for example toward the second aperture 33a side is formed around the second aperture 33a circularly, for example.

(e) Next, as shown in FIG. 3(e), removing the resist layer 34, and then etching the semi-insulating substrate 31 by using the mask layer 33. The etching of the semi-insulating substrate 31 is performed by the dry etching process, which used Ar gas or halogen gas, such as F and Cl, for example.

(f) First of all, the etching of the semi-insulating substrate 31 starts at a part exposed to a bottom of the second aperture 33a, for example, a range surrounded by the dotted line dl vertical to the surface of the semi-insulating substrate 31. Then, as shown in FIG. 3(f), a third aperture (small caliber VIA hole) 31c that passes through the semi-insulating substrate 31 according to the progress of etching is formed.

At this time, the etching goes to the outside where thickness is thick in order from an inner side where thickness is thin, and a diameter of the second aperture 33a is expanded in a second tapered region 33b of the mask layer 33, as well as the case of the resist layer 34 explained with FIG. 3(d).

Therefore, as for the semi-insulating substrate 31, for example, an illustrated upper inside diameter of the third aperture 31c becomes gradually large with expansion of a diameter of the second aperture 33a in parallel to formation of the third aperture 31c. In this case, progress of etching of, for example, the illustrated upper part of the third aperture 31c, for example, a part located in another surface 31b side, becomes early. Accordingly, as shown in the dotted line d5, the width W5 of the inside diameter of the aperture opened on the second surface 31b of the semi-insulating substrate 31 becomes larger than the width W6 of the inside diameter of the aperture opened on the first surface 31a of the semi-insulating substrate 31.

Therefore, the third aperture 31c having the third tapered region 31d where the width of the inside diameter becomes small gradually toward the first surface 31a of the semi-insulating substrate 31 from the second surface 31b of the semi-insulating substrate 31 is formed.

Next, as shown in FIG. 3(f), the mask layer 33 is removed. Then, the earth electrode 37 composed of metal, such as Au, is formed on the second surface 31b and the 3rd tapered region 31d of the third aperture 31c of the semi-insulating substrate 31, and the back side of the electrode 32 which faces the third aperture 31c by methods, such as vacuum evaporation or electroplating, and the small caliber VIA hole is completed.

At this time, the electrode 32 has a shape, which fills up the aperture of the hole which composes the small caliber VIA hole, for example.

About the VIA hole formation process applied to a part of the fabrication method of the semiconductor device according to the first embodiment of the present invention, as shown in the dotted line d5 of FIG. 3(e), as for the third aperture 31c, the whole is the third tapered region 31d, in the depth direction.

In order to form the earth electrode 37 securely, it is preferable for the whole of the depth direction to be a tapered region. However, it may be a configuration, which provides the tapered region in a part of third aperture 31c, for example, only partial region of the illustrated upper part of the third aperture 31c continuous from the second surface 31b of the semi-insulating substrate 31. In this case, although an effect is small compared with the case where the whole is the tapered region, the effect, which forms the earth electrode 37 securely is obtained.

Moreover, when forming the earth electrode 37 in the inner surface of the third aperture 31c, the mask layer 33 is removed. However, the earth electrode 37 can also be formed from on the mask layer 33, without removing the mask layer 33.

(Configuration of Etching Apparatus)

Figure 4:
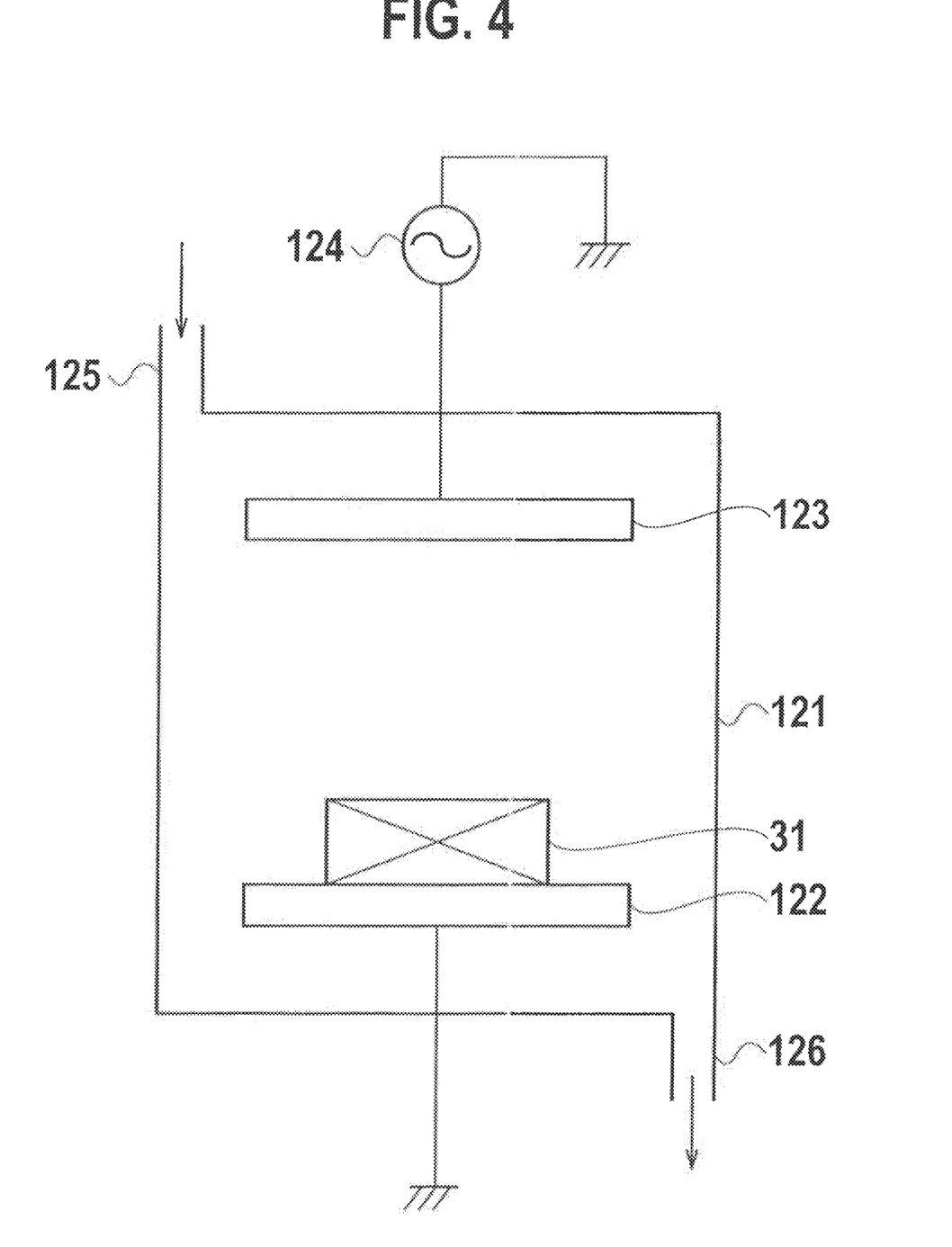
FIG. 4 In the fabrication method of the semiconductor device according to the first embodiment of the present invention, a schematic configuration diagram of an etching apparatus applied to a VIA hole formation process for a semi-insulating substrate is shown.

FIG. 4 shows a schematic configuration diagram of an etching apparatus applied to the VIA hole formation process for the semi-insulating substrate 31, in the fabrication method of the semiconductor device according to the first embodiment of the present invention.

A cathode 122 is placed, for example, at the lower side in a chamber 121. An anode 123 is placed at the upper part of the cathode 122 in a position, which opposes the cathode 122. For example, a high-frequency power supply 124 is connected to the anode 123, and the cathode 122 is earthed.

The semi-insulating substrate 31 to be etched is mounted, for example on the cathode 122. Moreover, a supply port 125 for supplying etching gas, for example, Ar gas, or gas including halogen related elements, such as F and Cl, is provided at the illustrated upper part of the chamber 121. An exhaust port 126 for exhausting the gas in the chamber 121 is provided at the illustrated lower part of the chamber 121.

In the above-mentioned configuration, the etching gas is sent in the chamber 121 from the supply port 125. The etching gas is excited by the high frequency, which the high-frequency power supply 124 generates, and the semi-insulating substrate 31 is etched in the action of the ion etc. which are accelerated, for example.

According to the configuration of the VIA hole formed of the above-mentioned small caliber VIA hole formation process, the tapered region is provided in the inner surface of the VIA hole of the semi-insulating substrate 31. In this case, the aperture of one side of the VIA hole becomes large, and an inclination of the inner surface of the VIA hole becomes a form where metal forming the earth electrode 37 is received. Therefore, when forming the earth electrode 37 by methods, such as vacuum evaporation and electroplating, the earth electrode 37 is formed securely and the disconnection caused by step is prevented.

Moreover, when a GaN substrate or a SiC substrate, a sapphire substrate, diamond substrate, etc. are used as the semi-insulating substrate 31, these substances are deficient in reactivity at the time of etching in order to form the VIA hole, and it is difficult to form the tapered region in the inner surface of the VIA hole.

For example, since the chemical etching is difficult for SiC, it becomes strong physical etching of sputtering nature, such as dry etching. Therefore, when forming the VIA hole, it is difficult to form the tapered region and it becomes a vertical VIA hole easily.

However, if a mask layer which is composed of Al etc. and which performed taper machining is used, also for a GaN substrate or a SiC substrate, the tapered region can be easily formed in the inner surface of the VIA hole, and the VIA hole without the disconnection caused by step is obtained.

Moreover, even if the aperture of one side of the hole which forms the VIA hole is large, the aperture by the side of the electrode 32 is small. Therefore, it is not necessary to enlarge the electrode 32, and a circuit is prevented from becoming oversize.

(Formation Process 1 of Multi Stage Via Hole)

In the fabrication method of the semiconductor device according to the first embodiment of the present invention, in the formation process of the above-mentioned small caliber VIA hole, it has the characteristic at the point which forms the large caliber VIA hole before forming the earth electrode 37, and forms the earth electrode layer (for example, refer to FIG. 5(c)) after forming the multi-stage VIA hole.

FIG. 5 is an explanatory diagram of the multi-stage VIA hole formation process applied to the fabrication method of the semiconductor device according to the first embodiment of the present invention, FIG. 5(a) is a formation process chart of the VIA hole 30 of the small caliber, FIG. 5(b) is a formation process chart of the VIA hole 20 of the large caliber, and FIG. 5(c) is a formation process chart of the earth electrode 23.

(a) First of all, as shown in FIG. 5(a), forming the small caliber VIA hole 30 according to the above-mentioned small caliber VIA hole formation process after forming the electrode 32 on the first surface of the semi-insulating substrate 11. By using the tapered mask layer composed of above-mentioned Al etc., the tapered region can be easily formed in the inner surface of the small caliber VIA hole 30 also for the semi-insulating substrate 11 consisting of a GaN substrate or a SiC substrate. Moreover, the width W1 of one side of aperture of the hole, which forms the small caliber VIA hole 30 is large, and the width W0 of the aperture at the side of the electrode 32 is small. Therefore, it is not necessary to enlarge the electrode 32 and the oversize of the circuit is prevented. In addition, the sidewall of the small caliber VIA hole 30 does not necessarily need to have tapered form, and may have a wall surface vertical essential substantially.

(b) Next, as shown in FIG. 5 (*b*), forming the large caliber VIA hole 20 by the same process step as the above-mentioned small caliber VIA hole formation process. A different point from the small caliber VIA hole formation process is a point which forms widely the width of the mask pattern 35 (FIG. 3(*a*)). By using the tapered mask layer composed of above-mentioned Al etc., the tapered region can be easily formed in the inner surface of the large caliber VIA hole 20 also for the semi-insulating substrate 11 consisting of a GaN substrate or a SiC substrate. Moreover, the width W2 of one side of aperture of the hole, which forms the large caliber VIA hole 20 is large, and the width of the aperture at the side of the electrode 32 is larger than W0. By controlling etching time, it can leave only the depth D1 for the part of the small caliber VIA hole 30, and the depth of the part of the large caliber VIA hole 20 can be set as D2.

(c) Next, as shown in FIG. 5(*c*), the earth electrode 23 composed of metal, such as Au, is formed in the second surface (back side) of the semi-insulating substrate 11, the internal wall surface 20*b* of the large caliber VIA hole 20, and the internal wall surface 30*a* of the small caliber VIA hole 30 by methods, such as vacuum evaporation or electroplating, and the multi stage VIA hole is completed.

At this time, the electrode 32 has a form, which fills up an aperture of the hole, which composes the small caliber VIA hole, for example.

In order to form the earth electrode 23 securely, it is preferable for the whole depth direction of the multi stage VIA hole which is composed of the small caliber VIA hole 30 and the large caliber VIA hole 20 to be the tapered region.

According to the fabrication method of the semiconductor device according to the first embodiment of the present invention to which the formation process 1 of the above-mentioned multi stage VIA hole is applied, as shown in FIG. 5 (*c*), the inductance of the source terminal electrodes 18, 18-1, 18-2, 18-3, 18-4, and 18-5 connected to the earth electrode 23 can be suppressed by connecting with the surface electrode 32 in minute size using the small caliber VIA hole 30 near the active layer, and extending the caliber near the earth conductor 26.

Furthermore, the efficiency of heat dissipation can be improved without extending the cavity area by the VIA hole directly under the heating region by performing eccentricity of the large caliber VIA hole 20 to the outside of the semiconductor chip, as shown in FIG. 1 to FIG. 2.

Furthermore, since the whole depth direction of the multi stage VIA hole which is composed of the small caliber VIA hole 30 and the large caliber VIA hole 20 is the tapered region as shown in FIG. 5(*c*), the disconnection caused by step of the VIA hole, etc. can be prevented.

(Formation Process 2 of Multi Stage Via Hole)

FIG. 6 is an explanatory diagram of another process step of the multi stage VIA hole formation process applied to the fabrication method of the semiconductor device according to the first embodiment of the present invention, FIG. 6(*a*) shows a formation process chart of the trench of the depth D1 acting as the small caliber VIA hole 30, FIG. 6(*b*) shows a formation process chart of the large caliber VIA hole 20, and FIG. 6(*c*) shows a formation process chart of the earth electrode 23.

(a) First of all, as shown in FIG. 6(*a*), forming the electrode 32 after forming the trench of the width W7 and the depth D1 on the first surface of the semi-insulating substrate 11 according to the dry etching process. In this process step, the etching apparatus shown in above-mentioned FIG. 4 is applicable.

(b) Next, as shown in FIG. 6(*b*), forming the large caliber VIA hole 20 by the same process step as the small caliber VIA hole formation process explained in FIG. 3. A different point from the small caliber VIA hole formation process is a point which forms widely the width of the mask pattern 35 (FIG. 3(*a*)). By using the tapered mask layer composed of Al etc., the tapered region can be easily formed in the inner surface of the large caliber VIA hole 20 also for the semi-insulating substrate 11 consisting of a GaN substrate or a SiC substrate. Moreover, the width W4 of one side of aperture of the hole, which forms the large caliber VIA hole 20 is large, and the width of the aperture at the side of the electrode 32 is formed more greatly than W7. By controlling etching time, it can leave only the depth D1 near the first surface of the semi-insulating substrate 11, and the depth of the part of the large caliber VIA hole 20 can be set as D2. As a result, as shown in FIG. 6(*b*), the bottom of the electrode 32 is etched by the formation process of the large caliber VIA hole 20, and the aperture of width W3 is formed. By the aperture hole which composes the width W3, the small caliber VIA hole of the depth D1 is formed as a result. At this time, the electrode 32 has a shape which covers the internal wall of the aperture hole which composes the width W3.

(c) Next, as shown in FIG. 6(*c*), the earth electrode 23 composed of metal, such as Au, is formed in the second surface (back side) of the semi-insulating substrate 11, and the internal wall surface 20*b* of the large caliber VIA hole 20 by methods, such as vacuum evaporation or electroplating, and the multi stage VIA hole is completed.

At this time, the electrode 32, which covers the internal wall of the aperture hole, which composes the width W3 is connected to the earth electrode 23.

In order to form the earth electrode 23 securely, it is preferable for the whole depth direction of the multi stage VIA hole which is composed of the small caliber VIA hole which has the aperture of the depth D1 and the width W3 and the large caliber VIA hole 20 to be a tapered region.

According to the fabrication method of the semiconductor device according to the first embodiment of the present invention which applies the formation process 2 of the above-mentioned multi stage VIA hole, as shown in FIG. 6(*c*), the inductance of the source terminal electrodes 18, 18-1, 18-2, 18-3, 18-4, and 18-5 connected to the earth electrode 23 can be suppressed by connecting with the surface electrode 32 in minute size using the small caliber VIA hole 30 near the active layer, and extending the caliber near the earth conductor 26.

Furthermore, the efficiency of heat dissipation can be improved without extending the cavity area by the VIA hole directly under the heating region by performing eccentricity of the large caliber VIA hole 20 to the outside of the semiconductor chip, as shown in FIG. 1 to FIG. 2.

Furthermore, since the whole depth direction of the multi stage VIA hole composed of the large caliber VIA hole 20 which contacted the small caliber VIA hole 30 at the bottom is the tapered region as shown in FIG. 6(*c*), the disconnection caused by step of the VIA hole, etc. can be prevented.

According to the semiconductor device according to the first embodiment of the present invention, and the fabrication method for the same, the inductance of the source terminal electrode connected to the earth electrode can be suppressed by connecting with the surface electrode in minute size using the VIA hole of the small caliber near the active layer, and extending the caliber near the earth conductor 26.

Furthermore, according to the semiconductor device according to the first embodiment of the present invention, and the fabrication method for the same, the efficiency of heat dissipation can be improved without extending the cavity area by the large caliber VIA hole directly under the heating region by performing eccentricity of the large caliber VIA hole to the outside of the semiconductor chip.

Furthermore, according to the semiconductor device according to the first embodiment of the present invention, and the fabrication method for the same, the tapered region where the width of the inside diameter changes to the internal wall surface of the multi stage VIA hole which is composed of the small caliber VIA hole and the large caliber VIA hole is formed, the conductive layer is securely formed in the internal wall surface of the VIA hole, and the VIA hole without disconnection caused by step can be formed.

Other Embodiments

The present invention has been described by the first embodiment mentioned above, as a disclosure including associated description and drawings to be construed as illustrative, not restrictive. With the disclosure, artisan might easily think up alternative embodiments, embodiment examples, or application techniques.

In addition, it cannot be overemphasized that the amplifying elements are applicable not only by FET (Field Effect Transistor) but other amplifying elements, such as HEMT (High Electron Mobility Transistor), LDMOS (Laterally Diffused Metal-Oxide-Semiconductor Field Effect Transistor), and HBT (Hetero-junction Bipolar Transistor).

Such being the case, the present invention covers a variety of embodiments, whether described or not. Therefore, the technical scope of the present invention is appointed only by the invention specific matter related appropriate scope of claims from the above-mentioned explanation.

According to the semiconductor device of the present invention, and the fabrication method for the same, the inductance of the source terminal electrode connected to the earth electrode can be suppressed by connecting with the surface electrode in minute size using the VIA hole of the small caliber near the active layer, and extending the caliber near the earth conductor.

Furthermore, according to the semiconductor device of the present invention, and the fabrication method for the same, the efficiency of heat dissipation can be improved without extending the cavity area by the large caliber VIA hole directly under the heating region by performing eccentricity of the large caliber VIA hole to the outside of the semiconductor chip.

Furthermore, according to the semiconductor device of the present invention, and the fabrication method for the same, the tapered region where the width of the inside diameter changes to the internal wall surface of the multi stage VIA hole which is composed of the small caliber VIA hole and the large caliber VIA hole is formed, the conductive layer is securely formed in the internal wall surface of the VIA hole, and the VIA hole without disconnection caused by step can be formed.

The semiconductor device and the fabrication method for the same according to the embodiments of the present invention are applied to a semiconductor device in which it is difficult for thinned layer, such as a SiC substrate and a GaN wafer substrate, and has wide industrial application fields, such as an internal consistency type power amplification element, an electric power MMIC (Monolithic Microwave Integrated Circuit), a microwave power amplifier, and a millimeter wave power amplifier.

The invention claimed is:

1. A semiconductor device comprising:
a semi-insulating substrate;
a gate electrode, a source electrode, and a drain electrode which are placed on a first surface of the semi-insulating substrate, and have a plurality of fingers, respectively;
a ground conductor placed on a second surface of an opposite side with the first surface of the semi-insulating substrate;
a gate terminal electrode, a source terminal electrode, and a drain terminal electrode which are placed on the first surface of the semi-insulating substrate, connecting a plurality of fingers, respectively, and formed for every the gate electrode, the source electrode, and the drain electrode;
an active layer formed on the semi-insulating substrate under the gate electrode, the source electrode, and the drain electrode;
a multi stage VIA hole composed of a small caliber VIA hole near the first surface, and a large caliber VIA hole near the second surface; and
a ground electrode which is formed in an internal wall surface of the multi stage VIA hole and the second surface of the semi-insulating substrate, and is connected from the ground conductor placed at the second surface side of the semi-insulating substrate for the source terminal electrode near the first surface, wherein
a central axis of the large caliber VIA hole is eccentric from a central axis of the small caliber VIA hole.

2. The semiconductor device according to claim 1, wherein the central axis of the large caliber VIA hole is eccentric in a direction which is away from the active layer relative to the central axis of the small caliber VIA hole.

3. The semiconductor device according to claim 2, wherein the semi-insulating substrate is an SiC substrate, a GaN substrate, a sapphire substrate, or a diamond substrate, or is a substrate in which the GaN epitaxial layer is formed on the semi-insulating substrate, or a substrate in which the hetero-junction epitaxial layer composed of GaN/AlGaN is formed.

4. The semiconductor device according to claim 1, wherein the semi-insulating substrate is an SiC substrate, a GaN substrate, a sapphire substrate, or a diamond substrate, or is a substrate in which the GaN epitaxial layer is formed on the semi-insulating substrate, or a substrate in which the hetero-junction epitaxial layer composed of GaN/AlGaN is formed.

* * * * *